USO10338116B2

(12) United States Patent
Lurz et al.

(10) Patent No.: US 10,338,116 B2
(45) Date of Patent: Jul. 2, 2019

(54) ELECTRICAL MEASURING SYSTEM AND METHOD FOR OPERATING THE SYSTEM

(71) Applicants: Horst Siedle GmbH & Co. KG, Furtwangen (DE); Friedrich-Alexander-Universitaet Erlangen-Nuernberg, Erlangen (DE)

(72) Inventors: Fabian Lurz, Erlangen (DE); Stefan Lindner, Erlangen (DE); Alexander Koelpin, Bischberg (DE); Ernst Halder, Stuttgart (DE); Peter Dingler, Aalen-Ebnat (DE); Gerold Sept-Enzel, Stuttgart (DE)

(73) Assignee: HORST SIEDLE GMBH & CO. KG, Furtwangen (DE)

( * ) Notice: Subject to any disclaimer, the term of this patent is extended or adjusted under 35 U.S.C. 154(b) by 0 days.

(21) Appl. No.: 15/723,516

(22) Filed: Oct. 3, 2017

(65) Prior Publication Data
US 2018/0106841 A1    Apr. 19, 2018

(30) Foreign Application Priority Data
Oct. 13, 2016 (DE) .................. 10 2016 119 562

(51) Int. Cl.
*G01R 23/14* (2006.01)
*G01R 23/00* (2006.01)
*G01R 23/02* (2006.01)

(52) U.S. Cl.
CPC ........... *G01R 23/145* (2013.01); *G01R 23/00* (2013.01); *G01R 23/02* (2013.01)

(58) Field of Classification Search
CPC ...... G01R 23/00; G01R 23/14; G01R 23/145; G01R 23/02; G01R 29/26; G01R 27/28; G01R 27/32
See application file for complete search history.

(56) References Cited

U.S. PATENT DOCUMENTS

| 4,808,912 | A | * | 2/1989 | Potter | ............... | G01R 27/06 |
| | | | | | | 324/601 |
| 5,170,126 | A | * | 12/1992 | Wedge | ............... | G01R 29/26 |
| | | | | | | 324/613 |

(Continued)

FOREIGN PATENT DOCUMENTS

DE    102013209364 A1    11/2014
EP         1067675 A1     1/2001

OTHER PUBLICATIONS

Extended European Search Report dated Mar. 15, 2018.
(Continued)

*Primary Examiner* — Thang X Le
(74) *Attorney, Agent, or Firm* — Harness, Dickey & Pierce, P.L.C.

(57) ABSTRACT

An electrical measuring system of a six-port circuit includes a delay line and a arithmetic unit. In a first operating mode, an electrical signal can be on the one hand transmitted directly to a first input terminal and on the other hand via the delay line to a second input terminal of the six-port circuit. In an embodiment, the measuring system is configured such that, in the second operating mode, it does not supply a signal to the first input terminal of the six-port circuit and it supplies a reference signal to the second input terminal of the six-port circuit.

37 Claims, 8 Drawing Sheets

(56) References Cited

U.S. PATENT DOCUMENTS

| | | | | |
|---|---|---|---|---|
| 7,061,221 B2* | 6/2006 | Niedzwiecki | ............ | G01R 27/04 |
| | | | | 324/646 |
| 7,772,827 B2* | 8/2010 | Evers | ...................... | G01R 27/32 |
| | | | | 324/76.74 |
| 8,874,391 B2* | 10/2014 | Taylor | ..................... | G01R 27/04 |
| | | | | 324/522 |
| 2003/0057940 A1* | 3/2003 | Tanimura | .......... | G01R 31/31924 |
| | | | | 324/756.07 |
| 2005/0247924 A1* | 11/2005 | Atwater | ................. | B82Y 20/00 |
| | | | | 257/13 |

OTHER PUBLICATIONS

German Office Action 10 2016 119 562.6 dated Jun. 19, 2017.
Fabian Lurz et. al., "Precise and Fast Frequerncy Determination of Resonant SAW Sensors by a Low-Cost Six-Port Interferometer", 2016, IEEE, International Instrumentatation and Measurment Technology Conference Proceedings, (12MTC), Taipei, May 23-26, 2016, pp. 1-6.
Rober Weigeel et. al, "A Fast and Precise Six-Port-based IFM Technique for Wireless Resonant SAW Sensing", 2016, IEEE, International Ultrasonics Symposium, pp. 1-4.

* cited by examiner

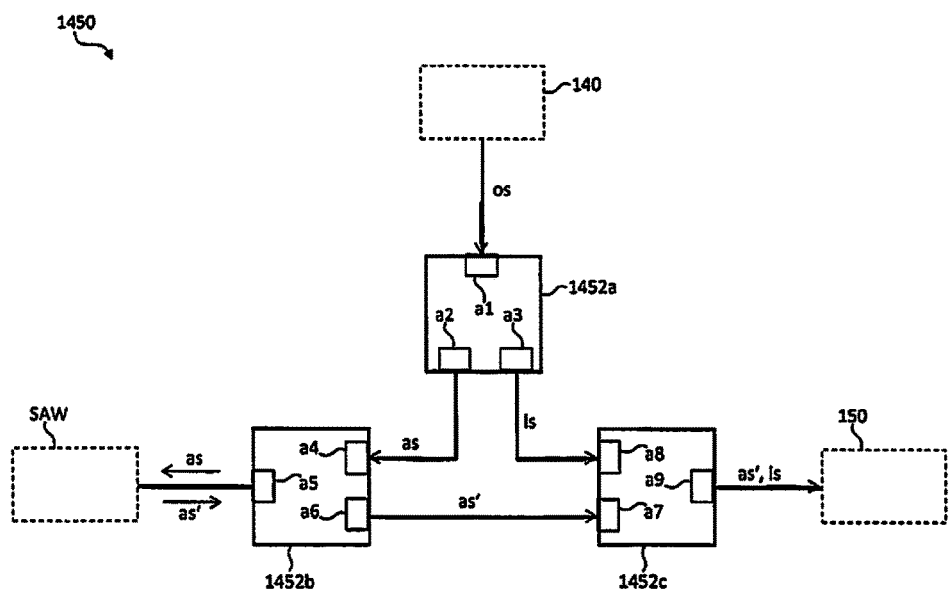

ELECTRICAL MEASURING SYSTEM AND METHOD FOR OPERATING THE SYSTEM

PRIORITY STATEMENT

The present application hereby claims priority under 35 U.S.C. § 119 to German patent application number DE 102016119562.6 filed Oct. 13, 2016, the entire contents of which are hereby incorporated herein by reference.

FIELD

At least one embodiment of the invention relates to an electrical measuring system with a six-port circuit, a delay line, and an arithmetic unit, wherein in a first operating mode an electric signal is transmitted on the one hand directly to a first input terminal and on the other hand via the delay line to a second input terminal of the six-port circuit.

At least one embodiment of the invention furthermore relates to an operating method for a measuring system of this type.

BACKGROUND

A measuring system is known, for example, from the DE 10 2013 209 364 A1.

SUMMARY

An object of an embodiment of the present invention is to further improve the precision of the known measuring system.

With a measuring system of the aforementioned type, this object is solved according to the invention in that the arithmetic unit is configured to detect a frequency of the signal in dependence on at least one output signal of the six-port circuit, wherein the measuring system is configured to, in a second operating mode, not supply a signal to the first input terminal of the six-port circuit, in particular not an inherent signal (meaning a signal purposely generated by the measuring system) and to supply to the second input terminal of the six-port circuit a predetermined reference signal, wherein the measuring system is furthermore also configured to detect in the second operating mode in dependence on at least one output signal from the six-port circuit the existence of an interference signal, in particular in the region of or proximate to the first input terminal.

According to the invention, it was discovered that in the second operating mode it is advantageously possible to determine that at least one interference signal is present in a region of the measuring system, in particular in a region of or proximate to the first input terminal, because the six-port circuit emits characteristic output signals if such an interference signal is present, especially in the frequency range of the reference signal. The interference signal is thus used so-to-speak as "input signal" for the first input terminal of the six-port circuit. In the second operating mode, no signal is consequently supplied to the first input terminal by the electrical measuring system or a therein contained signal source, thereby making it possible for an interference signal which may be present, and preferably exclusively this interference signal, to admit the first input terminal of the six-port circuit which, when the reference signal is simultaneously supplied to the second terminal of the six-port circuit, leads to one or several characteristic output signals of the six-port circuit that can advantageously be evaluated according to the invention.

Interference signals which may be present can thus be detected and the operation of the six-port circuit according to the invention can be adjusted accordingly. An interference-free coexistence with other identical and/or different systems is thus advantageously also possible because other users and/or systems on the same frequency band (as used for the electrical signal) are influenced less, or the measuring system according to the invention experiences less interference from these systems.

According to one embodiment, for example, the electrical signal frequency is not measured at least for a specified waiting period, if the presence of an interference signal has been detected in the second operating mode.

For alternative embodiments, a signal power of the interference signal can be detected and a decision made in dependence on the signal power of the interference signal whether to measure the frequency of the electrical signal in the first operating mode, despite the existence of the interference signal. A frequency measurement according to the invention can therefore still be realized in the first operating mode even with relatively low interference signals, whereas with comparatively strong interference signals, the first operating mode is initially not used as previously mentioned.

The arithmetic unit of another advantageous embodiment is configured to evaluate in the second operating mode at least two output signals and/or signals derived therefrom, received on at least two different output terminals of the six-port circuit, and to detect an interference signal in dependence on the evaluation. A particularly precise detection of interference signals is thus possible.

The arithmetic unit of one embodiment can comprise a microcontroller or a digital signal processor or the like.

The signals derived from the output signals of the six-port circuit can be filtered versions of the output signals that have been subjected, for example, to a low-pass filtering.

A different advantageous embodiment provides that the arithmetic unit is configured to evaluate in the second operating mode four output signals and/or signals derived therefrom, received at different output terminals of the six-port circuit, and to determine an interference signal in dependence on this evaluation, thereby making possible a further increase in the precision and/or the detection certainty with respect to detecting an interference signal. In particular, the present embodiment allows a more precise classification of the frequency of an interference signal.

According to another advantageous embodiment, the arithmetic unit is designed to detect essentially simultaneously at least two output signals and/or signals derived therefrom, which make possible especially precise measurements of the frequency of the electrical signals.

According to another advantageous embodiment, the measuring system is configured to assume the second operating mode to check for the existence of possible interference signals, thus obtaining information characterizing an interference signal, wherein the measuring system is configured to, in dependence on the information characterizing an interference signal, change from the second operating mode to the first operating mode for detecting a frequency of the electrical signal.

Another advantageous embodiment provides that the measuring system comprises at least one resonator which is configured to provide the electrical signal, wherein the at least one resonator in particular is configured as surface acoustic wave resonator, abbreviated SAW resonator (SAW=surface acoustic wave).

If a SAW resonator is used for the resonator, short and fading response signals are generally emitted by this resonator. In that case, the aforementioned six-port technology is particularly well suited to evaluate the SAW resonator signals.

According to a modification of the invention, the electrical signal frequency corresponds to a (momentary) resonance frequency of the resonator which, among other things, can depend on the temperature, or the pressure, or the strain to which the resonator is subjected. A change in the temperature, or the pressure, or the strain of the resonator leads to a change in the resonance frequency which can be detected by the six-port circuit in the first operating mode. In this way, the six-port circuit technology can be used for detecting a temperature, or a pressure, or a (mechanical) strain. For example, mechanical stresses for a machine element can advantageously be detected in this way, such as the torsion of a shaft.

The measuring system of another advantageous embodiment is provided with at least one signal generator which is configured to generate the reference signal and/or an excitation signal for one, respectively the resonator, wherein the resonator is then charged with energy via this excitation signal. The resonator subsequently can emit this energy again, meaning via the response signal with the resonance frequency. The frequency of the excitation signal preferably is at least somewhat in the range of the resonance frequency of the resonator in order to sufficiently excite it.

The signal generator of another advantageous embodiment is provided, for example, with an oscillator, in particular a controllable oscillator. The signal generator of one embodiment, for example, can be provided with a voltage-controlled oscillator (VCO), wherein this oscillator can be controlled, for example, by the arithmetic unit of the measuring system according to the invention.

The signal generator of another advantageous embodiment is provided with a frequency synthesizer where a phase-locked loop (PLL) is assigned to the oscillator which allows generating an especially frequency-stable signal, in a manner known per se, for example for use as a reference signal and/or an excitation signal.

The measuring system of a different embodiment is provided with a coupling device which is configured to transmit an excitation signal to at least one resonator and to receive an output signal from the at least one resonator and to transmit this signal to at least one input of the six-port circuit and/or to a power divider assigned to the six-port circuit. A particularly efficient supplying of the resonator and the six-port circuit with the respective signals is thus possible. As previously described in connection with different embodiments, the excitation signal can be generated by the signal generator. The power divider can be intended, for example, to supply to the first input terminal of the six-port circuit the resonator output signal, or a corresponding first portion thereof, such as 50% of the signal power, as electrical signal upon which the frequency measurement is to be based, wherein a second portion of the output signal, for example the additional 50% of the signal power, is supplied to an input of the delay line. For a preferred embodiment, the power divider can comprise, for example, at least one Wilkinson divider.

The coupling device of one preferred embodiment can comprise, for example, at least one circulator or directional coupler. Alternatively, the coupling device for another embodiment can comprise at least one transmitting/receiving switch (English: RX/TX switch).

Several switches (e.g. comprising three "ports") can furthermore also be provided for additional advantageous embodiments, for example to allow switch between a first switch position for the self-linearization, a second switch position for transmitting an excitation signal, and a third switch position for receiving, for example, a response signal to an excitation signal.

Another advantageous embodiment provides that the measuring system comprises a first switch that is configured to optionally output an input signal, received at its input, to a first output terminal of its output or a second output terminal of its output, wherein especially the input of the first switch can be connected to one or to the signal generator, wherein the first output terminal of the first switch can be connected to one or the coupling device, wherein the second output terminal of the first switch can be connected to at least one input of the six-port circuit, or to an input of a power divider assigned to the six-port circuit.

The measuring system of a further advantageous embodiment is provided with a second switch, configured to connect the second input of the six-port circuit optionally to a source that provides a or the reference signal, or to an output for the delay line. In this way, the six-port circuit can advantageously be supplied in an efficient manner with the signal for the second input terminal, which is required for the respective first or second operating mode.

The delay line of another advantageous embodiment comprises at least two optionally selectable delay line lengths. As a result, the precision of the frequency measurement can advantageously be increased further and, in particular, an increase in the unambiguous detection bandwidth achieved. An interference-free coexistence with other, identical and/or different systems can thus advantageously be improved further.

The measuring system of a different advantageous embodiment is configured such that in a third operating mode it can select a first length of the delay line and in a fourth operating mode a second length of the delay line, wherein the second delay line length differs from the first delay line length, wherein in particular the second delay line length is longer than the first delay line length. A frequency measuring of the electrical signal using the second delay line length especially advantageously results in increased measuring precision, while using a first, smaller delay line length advantageously creates a comparably larger unambiguous range for the frequency measuring.

The first delay line length of a further embodiment is designed particularly preferred in such a way that the unambiguous range for the frequency measuring in the first operating mode of the inventive measuring system covers the complete frequency range of an ISM (industrial, scientific, medical) band, in particular a frequency range between approximately 2400 megahertz (MHz) and approximately 2500 MHz.

The measuring system of a different embodiment is configured to supply at least at times a linearization signal on the one hand directly to the first input terminal of the six-port circuit, and on the other hand via the delay line to the second input terminal of the six-port circuit. The linearization signal can be a sine-shaped signal, similar to the electric signal, or the excitation signal, or the reference signal, wherein the linearization signal additionally has a known frequency and amplitude. As a result, the option of linearizing the measuring system, especially the calibration of the delay line, is advantageously provided.

The object of the present invention is furthermore solved with a method for operating an electrical measuring system with a six-port circuit, a delay line, and a arithmetic unit, wherein during a first operating mode an electric signal is supplied on the one hand directly to a first input terminal, and on the other hand via the delay line to a second input terminal of the six-port circuit, and wherein the arithmetic unit detects a signal frequency in dependence on at least one output signal from the six-port circuit, wherein the measuring system in a second operating mode does not supply a signal to the first input terminal of the six-port circuit and supplies a predetermined reference signal to the second input terminal of the six-port circuit, wherein furthermore the measuring system in the second operating mode determines the existence of an interference signal, particularly in the region of or proximate to the first input terminal, in dependence on at least one output signal from the six-port circuit.

For one advantageous embodiment, the arithmetic unit evaluates in the second operating mode at least two output signals received at different output terminals of the six-port circuit, and/or signals derived therefrom, and determines an interference signal in dependence on this evaluation, wherein the arithmetic unit, in particular in the second operating mode, evaluates four output signals which arrive at different output terminals of the six-port circuit, and/or signals derived therefrom, and determines an interference signal in dependence on this evaluation.

According to a further advantageous embodiment, the arithmetic unit detects essentially simultaneously at least two output signals and/or signals derived therefrom.

According to a different advantageous embodiment, the measuring system assumes the second operating mode to check for the presence of possible interference signals, thus obtaining information that characterizes an interference signal, wherein the measuring system switches from the second operating mode to the first operating mode in dependence on the information characterizing an interference signal (for example following a predetermined waiting period which can be determined in dependence on the information characterizing the interference signal, or not at all if the interference signal is too strong) so as to detect a frequency of the electric signal.

The measuring system of another advantageous embodiment determines in dependence on the information characterizing an interference signal a waiting period before switching from the second operating mode to the first operating mode.

According to a further advantageous embodiment, the measuring signal is provided with at least one signal generator, so as to make available via this signal generator a, respectively the reference signal and/or an excitation signal for a resonator. As previously mentioned, the signal generator for some embodiments may comprise an oscillator, and/or a controllable oscillator (e.g. VCO), and/or an oscillator with phase-locked loop.

The measuring system of another advantageous embodiment comprises a coupling device, wherein the measuring system output an excitation signal to at least one resonator via this coupling device and receives an output signal from the at least one resonator and transmits this signal to at least one input of the six-port circuit, and/or to a power divider assigned to the six-port circuit.

The measuring system of another advantageous embodiment is provided with a first switch, wherein the measuring system by means of the first switch output an input signal, supplied to its input and especially a reference signal or an excitation signal for a resonator, optionally either to a, respectively the coupling device, or to an input of the six-port circuit, or to an input of a power divider assigned to the six-port circuit.

According to yet another advantageous embodiment, the measuring system is provided with a second switch, wherein the measuring system via the second switch optionally connects the second input of the six-port circuit to a source providing a, respectively the reference signal or to an output of the delay line.

According to a different advantageous embodiment, the delay line has at least two, optionally selectable delay line lengths, wherein the measuring system selects a first delay line length in a third operating mode and selects a second delay line length in a fourth operating mode, and wherein the second delay line length differs from the first delay line length, meaning in particular that the second delay line length is longer than the first delay line length.

According to another advantageous embodiment, the electric signal, respectively the excitation signal or the reference signal, is located in at least one ISM (industrial, scientific, medical) frequency band, especially in a frequency band ranging from 2400 MHz to approximately 2500 MHz.

The measuring system of another advantageous embodiment sends out at least at times at least one data frame, in particular a beacon data frame according to the IEEE 802.11 protocol family (and/or according to at least one of the following protocols: IEEE 802.15.4, especially ZigBee and/or Bluetooth), in particular intended to announce the presence of a transmitter to other systems that may be located within radio range, in particular a system operating according to the IEEE 802.11 protocol family and/or one of the following protocols: IEEE 802.15.4, especially ZigBee and/or Bluetooth). Other systems (e.g. WLAN, wireless local area network, router, ZigBee, Bluetooth, other WPAN or PAN systems) which evaluate the beacon data frame of the measuring system according to the invention can thus advantageously determine that the communication or radio channel used by the measuring system for transmitting the beacon data frame is in use, which may cause these other systems to no longer use the respective radio channel in the future, thereby resulting in fewer interference signal interfering with the frequency range used by the inventive system.

Another advantageous embodiment provides for the measuring system to transmit at least one data frame, especially a beacon data frame according to the IEEE 802.11 protocol family, if it was previously determined during the second operating mode that an interference signal is present with a signal power exceeding a threshold value.

BRIEF DESCRIPTION OF THE DRAWINGS

The description below of exemplary embodiments of the invention discloses additional features, options for use and advantages of the invention which are shown in the Figures of the drawings. All described or shown features by themselves or in any combination thereof form the subject matter of the invention, regardless of how they are summarized in the patent claims or the references back, as well as regardless of how they are formulated or described in the description or represented in the Figures.

Shown in the drawing are in:

FIG. 7 A simplified block diagram of an embodiment of the coupling device according to the invention.

DETAILED DESCRIPTION OF THE EXAMPLE EMBODIMENTS

Figure 1:
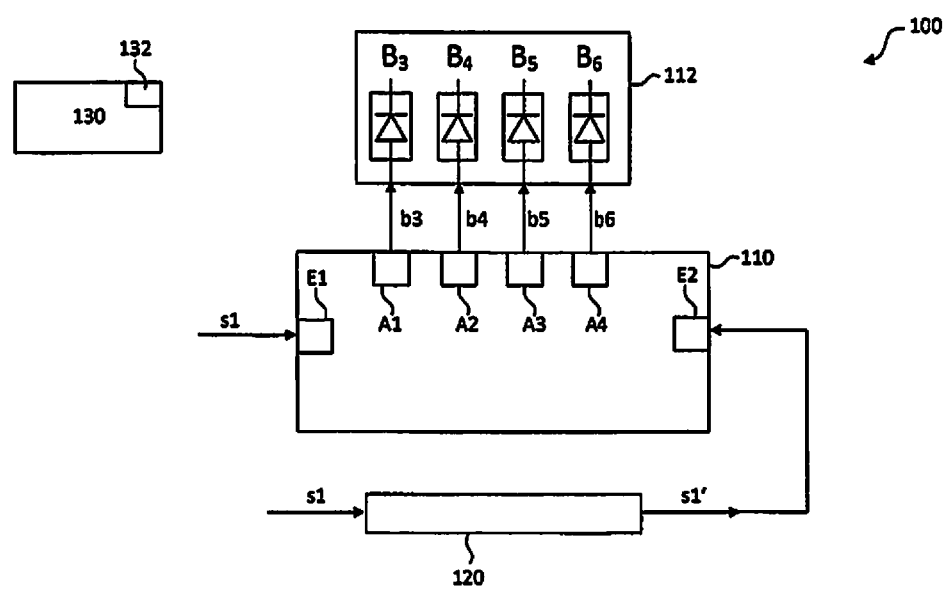
FIG. 1 A schematic block diagram of a first embodiment of the measuring system according to the invention, in a first operating mode.

FIG. 1 schematically shows a block diagram of a first embodiment of the measuring system 100 according to the invention, operating in a first operating mode.

The measuring system 100 comprises a six-port circuit 110, a delay line 120, and an arithmetic unit 130. The six-port circuit 110 is provided with a first input terminal E1 and a second input terminal E2, by means of which input signals can be supplied to the six-port circuit 110, in a manner known per se. In the present case, the measuring system 100 is configured to, in a first operating mode, supply an electrical signal s1 on the one hand directly to the first input terminal E1 of the six-port circuit 110 and on the other hand to provide the electrical signal s1 via the delay line 120 to the second input terminal E2 of the six-port circuit 110.

The delay line 120 delays in a manner known per se (runtime principle) the electrical signal s1 supplied to it, so that a delayed variant s1' is received at its output. The delayed variant s1' comprises a corresponding phase displacement d_phi, as compared to the electrical signal s1 which is supplied to the first input terminal E1.

The phase displacement d_phi depends on the frequency of the electrical signal s1, according to the following equation:
d_phi=2*Pi*f*t_dl, wherein "*" is the multiplication operator, wherein Pi is the circle number (3.141, . . . ), wherein f is the frequency of the electrical signal s1, wherein t_dl is the delay time to which the electrical signal s1 is subjected when passing through the delay line 120.

The six-port circuit 110 is configured to evaluate this phase displacement between the signals s1, s1' which is caused by the delay line 120. For this, the six-port circuit 110 can superimpose the input signals s1, s1', for example, using four different phase displacements 0°, 90°, 180°, 270°, thereby obtaining a total of four output signals b3, b4, b5, b6.

Especially preferred, the six-port circuit 110 can also be configured to subject the four output signals b3, b4, b5, b6 to a downward conversion of the frequency (English: down-conversion), which is indicated for the present case in FIG. 1 by the diode symbols of block 112, which are not designated further. Accordingly, four additional output signals $B_3$, $B_4$, $B_5$, $B_6$, which are respectively baseband signals, are received at the output of block 112. The four additional signals $B_3$, $B_4$, $B_5$, $B_6$, which are each present in the form of a corresponding electrical voltage, form a complex output vector $Z=(B_5-B_6)+j(B_3-B_4)$. Based on its phase, the aforementioned phase displacement d_phi can be determined in a manner known per se (see the following equation: d_phi=$\tan^{-1}((B_3-B_4)/(B_5-B_6))$, wherein $\tan^{-1}( )$ is the inverse tangent function (arctangent). Insofar as the delay time t_dl is known, the frequency of the electrical signal s1 can be determined as follows:

$$f=(d\_phi)/(2*Pi*t\_dl).$$

According to one embodiment of the inventive method, the arithmetic unit 130 can advantageously realize the above-mentioned computations by using the six-port circuit 110 or the block 112. According to the invention, these computations for measuring the frequency f are made in a first operating mode of the measuring system 100. This state is illustrated in FIG. 1.

Figure 2:
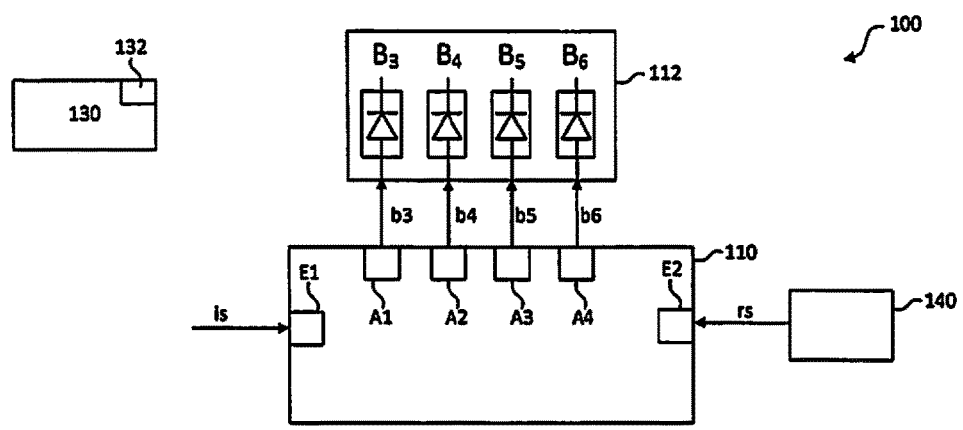
FIG. 2 A schematic block diagram of the measuring system according to FIG. 1, in a second operating mode.

According to the invention, at least a second operating mode is provided for the measuring system 100. An operating state corresponding to the second operating mode is shown in FIG. 2. In contrast to the configuration shown in FIG. 1, no input signal is supplied in the second operating mode to the first input terminal E1—see FIG. 2—so that only interference signals is, which may be present in a region of the measuring system 100, in particular in a region of or proximate to the first input terminal E1, are present at the first input terminal E1. The measuring system 100 is furthermore configured to supply in the second operating mode a predetermined reference signal rs to the second input terminal E2 of the six-port circuit 110. In the present case, that is achieved with a signal generator 140 which outputs, for example, a sine-shaped output signal with a specifiable frequency and amplitude to the second input terminal E2 of the six-port circuit.

The signal generator 140 of preferred embodiments can furthermore be configured to output output signals, in particular sine-shaped output signals, having different or changeable frequency.

According to the invention, the measuring system 100 is configured to detect the existence of a, respectively the interference signal is in the second operating mode, in dependence on at least one output signal b3, b4, b5, b6 of the six-port circuit 110, especially in a region of or proximate to the first input signal E1.

As a result, it can advantageously be determined whether in the region of the measuring system 100 or in the region of or proximate to the first input terminal E1 an interference signal is may be present which could possibly interfere with the measuring operation, respectively the determination of the frequency of the electrical signal s1 during the first operating mode.

The arithmetic unit 130 of one preferred embodiment is configured to evaluate in the second operating mode at least two output signals b3, b4 and/or signals $B_3$, $B_4$ derived therefrom, which are received at different output terminals A1, A2 of the six-port circuit 110, and to determine the presence of the interference signal is (for example its power and/or frequency) based on this evaluation.

The arithmetic unit 130 is configured especially preferred to evaluate in the second operating mode four output signals b3, b4, b5, b6 that are received at four different output terminals A1, A2, A3, A4 of the six-port circuit 110, meaning all output signals, and/or signals $B_3$, $B_4$, $B_5$, $B_6$ derived therefrom, and determine the presence of an interference signal is in dependence on the evaluation, thus resulting in increased precision or detection safety as compared to an evaluation of less than four output signals.

According to one embodiment, the arithmetic unit 130 can evaluate the absolute value of the output signals b3, b4, b5, b6, and/or the signals $B_3$, $B_4$, $B_5$, $B_6$ derived therefrom, so as to determine the presence of an interference signal is or to determine a power or a frequency.

According to one preferred embodiment, the arithmetic unit 130 can be provided for this with an analog/digital converter 132, which is preferably configured to detect essentially simultaneously at least two output signals b3, b4, and/or the signals $B_3$, $B_4$ derived therefrom. The expression essentially simultaneously here means in particular that the respective signals can be detected at different sampling times, which timewise are spaced apart maximally approximately 100 ns (nanoseconds), especially preferred approximately 10 ns.

According to one preferred embodiment, the measuring system 100 is designed to assume the second operating mode to check for interference signals is that may be present, thus obtaining information characterizing an interference signal, wherein the measuring system 100 furthermore is configured to change from the second operating mode to the first operating mode, in dependence of the information characterizing an interference signal, so as to determine a frequency of the electrical signal sl.

Figure 6A:
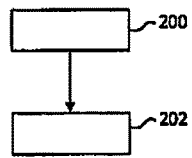
FIG. 6A A simplified flow chart of an embodiment of the method according to the invention.

FIG. 6A, for example, shows a simplified flow chart for an embodiment of the inventive method. In step 200, the measuring system 100 (FIGS. 1, 2) assumes the second operating mode according to the invention, so as to determine whether an interfering signal is present in a region of the measuring system 100, especially in a region of or proximate to its first input terminal E1. In this step 200, the arithmetic unit 130 does not actively supply an input signal to the first input terminal E1, respectively in general to the measuring system 100, so that possibly present interfering signals is can couple into the input terminal E1. According to FIG. 2, a reference signal rs with predetermined frequency and/or amplitude is furthermore supplied in step 200 to the second input terminal E2 by the signal generator 140. The reference signal can be located, for example, in an ISM frequency band in the range of approximately 2400 MHz to approximately 2500 MHz. The measuring system 100 according to the invention subsequently determines the presence of an interference signal is in step 200 and, if applicable, the signal power and/or other characteristics of the signal.

Insofar as the signal power of the interference signal is falls below a specifiable threshold value or there is no interference signal at all, the measuring system 100 according to the invention changes to a first operating mode which is represented by the additional step 202 (see also FIG. 6A). In the first operating mode, respectively in step 202, the inventive measuring system 100 realizes in a manner known per se a frequency measurement of the electrical signal sl—see FIG. 1 and the associated preceding description.

The step 200 according to the invention advantageously ensures that a frequency measurement according to step 202 is carried out, for example, only if no significant interference signals are present, thus ensuring that an especially precise frequency measurement can be realized.

The measuring system 100 (FIG. 1) of another preferred embodiment is provided with at least one resonator that is configured to provide the electrical signal, wherein the at least one resonator in particular is configured as surface acoustic wave resonator.

Figure 3:
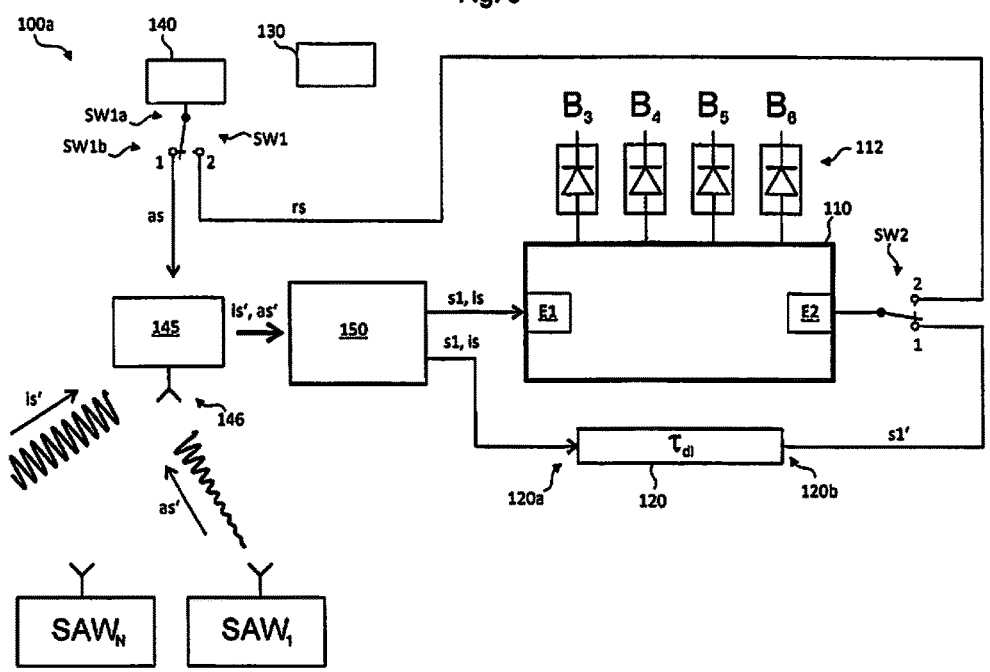
FIG. 3 A schematic block diagram of a second embodiment of the measuring system according to the invention.

In this connection, FIG. 3 shows a schematic block diagram for a second embodiment 100a of the measuring system according to the invention. The measuring system 100a comprises a six-port circuit 110, as previously described with reference to the embodiment according to FIGS. 1 and 2. The measuring system 100a in FIG. 3 also comprises a delay line 120 as previously described with reference to the embodiment according to FIGS. 1, 2. The measuring system 100a furthermore comprises an arithmetic unit 130 which controls an operation of the measuring system 100a in the manner as described in more detail below.

In addition to the components 110, 112, 120, 130, the measuring system 100a comprises a signal generator 140 which is preferably configured as frequency synthesizer for high-frequency signals (English: RF, radio frequency, synthesizer). The signal generator 140 is provided, for example, with an oscillator having a phase locked loop (not shown) which can generate in a manner known per se an especially frequency-stable signal (e.g. in the radio frequency range of approximately 2400 MHz to approximately 2500 MHZ in the present case), for example for use as reference signal and/or excitation signal for the surface-wave resonator.

As shown in FIG. 3, an output signal generated by the signal generator 140 can be supplied via a first switch SW1 in the form of an excitation signal as for a surface acoustic wave resonator $SAW_1$ to a coupling device 145. The first switch SW1 must be moved for this to the first switch position, given the reference "1" in FIG. 3. At its input SW1a, the first switch SW1 receives the output signal from the signal generator 140 and, in dependence on the switch position of the first switch SW1, the output signal from the signal generator 140 is then output from the output SW1b of the first switch SW1, either as excitation signal as (switch position "1") to the coupling device 145 or as reference signal rs (switch position "2") to the second input terminal E2, as described further below.

The coupling device 145 is configured to output the excitation signal as to at least one resonator $SAW_1$, $SAW_N$ and to receive an output signal as' of the at least one resonator $SAW_1$, $SAW_N$ and to output this signal to at least one input terminal E1 of the six-port circuit 110 or to a power divider 150 that is assigned to the six-port circuit 110. In the present case, a power divider 150 is arranged between the first input terminal E1 of the six-port circuit 110 and the coupling device 145, which divides a signal emitted by the coupling device 145, in a manner known per se, and then supplies the resulting signal portions, as can be seen in FIG. 3, either to the first input terminal E1 of the six-port circuit 110 or to an input 120a of the delay line 120.

In this way, the signal generator 140 can provide an output signal which is supplied as excitation signal as to the surface acoustic wave resonator $SAW_1$, that is to say via the coupling device 145 which receives the excitation signal as at one input and then transmits the excitation signal as, for example, to the first surface acoustic wave resonator $SAW_1$, thus exciting oscillations in the first resonator $SAW_1$, in a manner known per se, especially surface acoustic wave oscillations, thereby stimulating it to emit a response signal as'. The coupling device 145 is furthermore configured to receive the response signal as' from the first surface acoustic wave resonator $SAW_1$ and to further transmit it to the power dividers 150, as can be seen in FIG. 3.

According to one embodiment, the coupling device 145 can be provided, for example, with at least one circulator and/or directional coupler. Alternatively, the coupling device 145 of a different embodiment can comprise at least one, if applicable also several, transmitting/receiving switches (English: RX/TX switch).

As previously described, the response signal as' that is initially supplied to the power divider 150 is divided therein, for example, into two partial signals with the same signal strength. In the present case, these represent the electrical signal s1, for which the frequency is to be determined via the measuring system 100a, in particular via its six-port circuit 110, for example in the operating mode described above with reference to FIG. 1.

As previously described with reference to FIG. 1, the electrical signal s1 is on the one hand supplied directly to the first input terminal E1 of the six-port circuit 110. On the other hand, the electrical signal s1 is supplied via the delay line 120 to a second input terminal E2 of the six-port circuit 110. In the process, a delayed electrical signal s1' is received at the output 120 of the delay line 120 which, with respect to its frequency, corresponds to the electrical signal s1, but is delayed by an interval characterizing the delay line 120 because of passing through the delay line 120. In other words, the delayed electrical signal s1' is phase delayed, relative to the electrical signal s1, which phase delay depends on the characteristics of the delay line 120.

In the present case, a second switch SW2 is arranged between the output 120 on the delay line 120 and the second input terminal E2 of the six-port circuit 110. To be able to conduct the delayed electrical signal s1' from the delay line 120 to the second input terminal E2, the second switch SW2 must be moved to the first switch position given the reference "1" in FIG. 3. The delayed electrical signal s1' is then supplied to the second input terminal E2 of the six-port circuit 110, and the frequency of the electrical signal s1 can be measured in the manner as described several times before. For example, the arithmetic unit 130 can again evaluate one or several output signals from the six-port circuit 110 or one and/or several signals $B_3$, $B_4$, $B_5$, $B_6$, derived therefrom.

According to one preferred embodiment of the measuring system 100a, the first operating mode according to the invention which is used for measuring the frequency of the electrical signal s1 accordingly is characterized in that the first switch SW1 as well as the second switch SW2 respectively assumes its first switch position (number "1"). This operating mode is shown in FIG. 3.

For another advantageous embodiment, several resonators can be provided, for example N many resonators $SAW_1, \ldots, SAW_N$. These resonators can be admitted, for example with the excitation signal as in a time-multiplex operation, meaning sequentially one after another, wherein a corresponding frequency measurement of the respective response signals from the several resonators can also occur sequentially.

According to a different embodiment, the several resonators can also comprise different resonance frequencies, and the signal generator 140 can advantageously be controlled, for example with the arithmetic unit 130, so that it generates in each case matching excitation signals with the respective frequency for the different resonators.

It is particularly advantageous if the measuring system 100a, shown in FIG. 3, in addition to using the first operating mode for measuring the frequency of the electrical signal s1 can also assume the second operating mode according to the invention, which can serve to determine interference signals. For this, the first switch SW1 as well as the second switch SW2 respectively occupy the second switch position (reference number "2"). This operating mode is not shown in FIG. 3, but is explained in the following.

Once the first switch SW1 assumes its second switch position, the output signal generated by the signal generator 140 is transmitted via the output SW1b of the first switch SW1 as reference signal rs to the second switch SW2 which, while in its second switch position "2," supplies the reference signal rs to the second input terminal E2 of the six-port circuit 110. In this way, the output signal generated by the signal generator 140 is supplied directly as reference signal rs to the second input terminal E2.

Since the first switch SW1 in the second operating mode is in its second switch position "2," the output signal from the signal generator 140 is furthermore not transmitted to the coupling device 145, so that accordingly no excitation signal as can be transmitted by the coupling device 145 to at least one resonator $SAW_1$ and a corresponding response signal as' cannot be received.

Rather, in this second operating mode, interference signals is', present in the region of the measuring system 100a, can be coupled into one input of the coupling device 145 in place of a response signal as' from a resonator, so that the coupled-in interference signals is' are supplied to the power divider 150 and are divided therein. This results in an interference signal is at the output of the power divider 150 which, analogous to the electrical signal s1 in the first operating mode, is supplied directly to the first input terminal E1 of the six-port circuit 110. The other portion of the interference signal is arrives at the delay line 120 and is delayed therein, but is not transmitted further to the second input terminal E2 of the six-port circuit 110 because the second switch SW2 in the above-described operating mode occupies its second switch position "2." As a result, the reference signal rs made available by the signal generator 140 is supplied to the second input terminal of the six-port circuit 110.

The interference signal is which may be present, is supplied during the second operating mode, described in the above, to the first input terminal E1 of the six-port circuit 110, and the reference signal rs is supplied to the second input terminal E2 of the six-port circuit 110.

The measuring system 100 A is designed such that in this second operating mode, in dependence on at least one output signal of the six-port circuit 110, it can detect the presence of the interference signal is, in particular in a region of or proximate to the first input terminal E1. For this, the measuring system 100 a, respectively its arithmetic unit 130, can evaluate at least one output signal of the six-port circuit 110 and/or at least one signal derived therefrom.

As shown in FIG. 3, it is particularly preferred if the arithmetic unit 130 of the measuring system 100a is configured to evaluate in the second operating mode four output signals b3, b4, b5, b6 received at four different output terminals A1, A2, A3, A4 (FIG. 1) of the six-port circuit 110, i.e. all output signals, and/or signals $B_3$, $B_4$, $B_5$, $B_6$ (FIG. 3) derived therefrom, and, in dependence on this evaluation, to determine an interference signal is, therefore obtaining a higher precision as compared to the evaluation of less than four output signals.

For a different embodiment, the arithmetic unit 130 of the measuring system 100a can evaluate, for example, an absolute value for the output signals b3, b4, b5, b6 and/or the signals $B_3$, $B_4$, $B_5$, $B_6$ derived therefrom, so as to determine the existence of an interference signal is or to determine its power.

For a particularly preferred embodiment, the arithmetic unit 130 can evaluate an amplitude or an absolute value of the derived signals $B_3$, $B_4$, $B_5$, $B_6$ to obtain information on the possible existence of an interference signal is. For example, the evaluation can involve a threshold value detection or the like. With another advantageous embodiment, for example, the evaluation can involve an analysis of the absolute value of the derived signals, relative to a time change.

According to another advantageous embodiment, an attenuator, preferably a controllable attenuator, can be arranged between the signal generator 140 output (FIG. 3) and the input SW1a of the first switch SW1, which further increases the flexibility and precision for operating the measuring system 100a. For example, the controllable attenuator can be controlled by the arithmetic unit 130 so as to transmit excitation signals as with different amplitudes as output signals from the signal generator 140. This can advantageously be used for a linearizing the measuring system 100a and, for example, for configurations which comprise several resonators and are respectively positioned at different distances to the coupling device 145. As a result, a correspondingly different free space damping of the excitation signals as or the corresponding response signals as' from the resonators can thus be compensated.

Figure 6B:
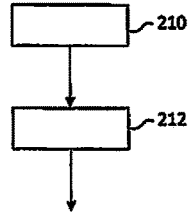
FIG. 6B A simplified flow chart of a second embodiment of the method according to the invention.

FIG. 6B shows a simplified flow chart for a second embodiment of the inventive method which can be realized, for example, with the measuring system 100a according to FIG. 3.

In a first step 210, the two switches SW1, SW2 are respectively moved to their second switch position "2," for example controlled by the arithmetic unit 130. As a result, the measuring system 100a initially assumes the second operating mode in step 210 in which it is checked whether interference signals is are present. As described in the above, the signal generator 140 generates for this an output signal usable as reference signal rs, while the first input terminal E1 of the six-port circuit 110 is not actively supplied with a signal by the measuring system 100a or its signal generator 140 or a different component thereof. As described in the above, in step 210 the arithmetic unit 130 subsequently realizes an evaluation of one or several output signals of the six-port circuit 110, thus making it possible to determine the presence of interference signals is.

According to a preferred embodiment, the measuring system 100a (FIG. 3) determines information that characterizes an interference signal, for example via the arithmetic unit 130, and the measuring system 100a then switches to the first operating mode (compare step 212 in FIG. 6B), preferably in dependence on information characterizing an interference signal. In step 212, a frequency of the electrical signal s1 (FIG. 3) can then be determined in the first operating mode. For this, the two switches SW1, SW2 are respectively moved to the first switch position "1," as previously described.

For one embodiment, at least one of the switches SW1, SW2 is configured as so-called SPDT switch (single pole double throw) or changeover switch.

One preferred embodiment provides that in dependence on the information characterizing an interference signal, the measuring system 100a determines a waiting period before the changeover occurs during step 212 from the second operating mode to the first operating mode, that is following step 210.

A comparably long waiting period can be selected, for example, if the information characterizing the interference signal indicates that an interference signal with comparably high signal power is present. In that case, a comparably long waiting period makes sense prior to the changeover to the first operating mode, during step 212, because it should be assumed that the interference signal has died away by the end of the waiting period or has a lower signal power.

A comparably short waiting time can be selected, for example, if the information characterizing the interference signal indicates that an interference signal with comparatively low signal power is present, or no interference signal at all. In that case, it is possible to move from step 210 directly to step 212, meaning the operation for measuring the frequency of the electrical signal s1 can start.

According to a particularly preferred embodiment, a check for interferences is again made following the waiting period, meaning step 210 is repeated, prior to changing to the first operating mode, meaning step 212. For this embodiment, a change to the first operating mode, meaning to step 2012, advantageously takes place only if it was determined during the second check for interferences, carried out following the above-mentioned waiting period, that no or no significant interference signals are present, so that a precise measurement is possible in step 212.

According to the invention, the output signal from the signal generator 140, meaning the reference signal rs, is used in the second operating mode so to speak as local oscillator signal to form a direct conversion receiver together with the six-port circuit 110, for down-mixing an interference signal is that may be present and is located in a similar frequency range as the reference signal rs (and which consequently would interfere with a measuring of the frequency of the electrical signal s1 which, for preferred embodiments, normally corresponds to the frequency of the reference signal rs), meaning to transform the signal from the radio frequency range (English: RF) to a baseband position. In other words, in addition to measuring the frequency of an electrical signal s1, the measuring system 100, 100a according to the invention can advantageously be used to check for interference signals in the above-described second operating mode.

Some embodiments can optionally comprise low-pass filtering ("base-band filtering" which is not shown), which spectrally limits the mixed down output signals $B_3$, $B_4$, $B_5$, $B_6$, for example to a bandwidth that is also used for the frequency measuring of the electrical signal s1 in the first operating mode. Thus, to take into consideration according to the invention the interference signal is in the second operating mode, only those spectral portions of the interference signal is are advantageously considered, which could also interfere, if applicable, with the frequency measurement in the first operating mode. According to one embodiment, the low-pass filters can be configured as discrete elements. Alternatively, a low-pass filtering can also be realized with the arithmetic unit 130, using corresponding methods for the digital signal processing.

Figure 4:
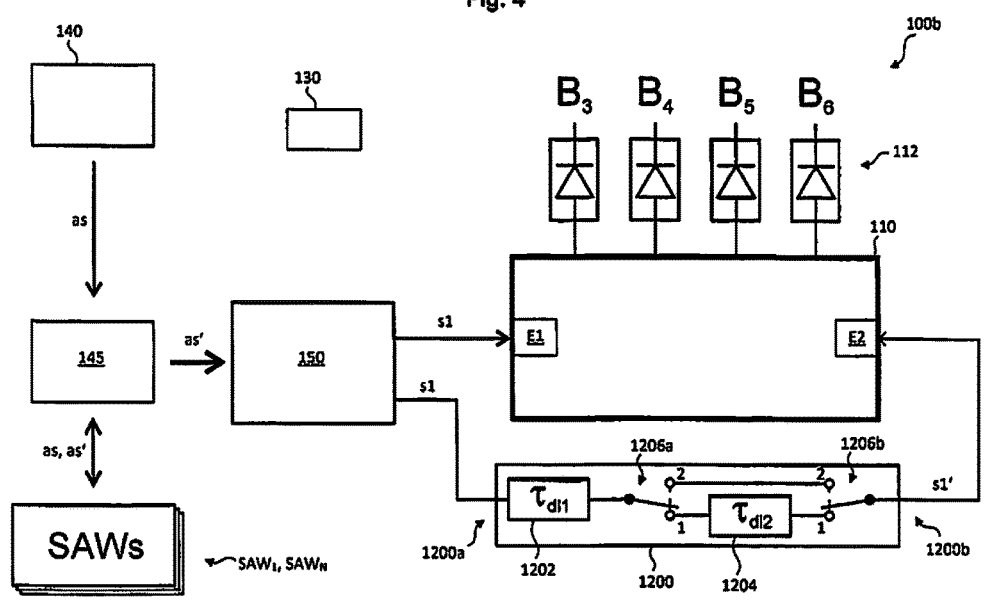
FIG. 4 A schematic block diagram of a third embodiment of the measuring system according to the invention.

FIG. 4 schematically shows a block diagram of a third embodiment 100b of the inventive measuring system. The components 110, 112, 130, 140, 145, 150 in FIG. 4 essentially correspond with respect to their function to the respective components of the embodiment 100a, described in the above with reference to FIG. 3, which is why they are not described in further detail in the following.

In contrast to the embodiment 100a of the measuring system, described in the above with reference to FIG. 3, the measuring system 100b according to FIG. 4 has a differently designed delay line 1200. The delay line 1200 comprises two optionally selectable delay line lengths, realized in the present case with a first partial delay line 1202 and a second partial delay line 1204 in the delay line 1200. With the aid of two switches 1206a, 1206b, for example controllable with the arithmetic unit 130, it can be determined whether an electrical signal s1 that is supplied to the delay line 1200 at its input 1200a is delayed by a first, comparatively short delay time, or a second, comparatively long delay time so as to obtain the delayed signal s1' at the output 1200b.

Insofar as both switches 1206a, 1206b of the delay line 1200 respectively occupy their second switching state, in FIG. 4 respectively given the reference "2," the first and shorter delay time is realized by the delay line 1200. In that case, only the first partial delay line 1202 is effective, wherein this characterizes a third operating mode for the measuring system 100b.

On the other hand, if both switches 1206a, 1206b of the delay line 1200 occupy respectively the first switching state, in FIG. 4 given respectively the reference "1," the second and longer delay time is realized by the delay line 1200. In that case, both partial delay lines 1202, 1204 are effective and are switched sequentially one after another. This characterizes a fourth operating mode of the measuring system 100b.

As previously described with reference to FIG. 1, the measuring system 100b according to FIG. 4 can also detect a frequency of the electrical signal sl. For example, this configuration can be used to determine a (momentary) resonance frequency of at least one resonator $SAW_1$, $SAW_N$.

According to one embodiment, it is especially advantageous if the fourth operating mode is selected for measuring the frequency of the electrical signal s1, meaning a delay line 1200 operating mode with long delay time, thereby advantageously resulting in a particularly high measuring precision.

According to a different embodiment, the third operating mode can advantageously be selected for measuring the frequency of the electrical signal s1, meaning a delay line operation with comparatively short delay time, since this advantageously results in a large unambiguous range for determining the frequency of the electrical signal s1. With some embodiments, the unambiguous range can advantageously comprise the complete ISM frequency band of approximately 2400 MHz to approximately 2500 MHz.

For additional embodiments, it is also conceivable to carry out measurements in the fourth and the third operating mode to determine the frequency of the electrical signal s1.

Figure 6C:
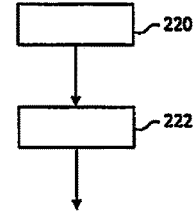
FIG. 6C A simplified flow chart of a third embodiment of the method according to the invention.

FIG. 6C shows a simplified flow chart of a third embodiment of the inventive method which can be realized, for example, with the measuring system 100b according to FIG. 4. In a first step 220, the measuring system 100B according to FIG. 4 is operated in the third operating mode, meaning with comparatively short delay time of the delay line 1200. As mentioned before, this results in a large unambiguous range for the frequency measurement. In particular, it can also be determined whether an interference signal is is present. For this, the signal generator 140 can advantageously be configured to transmit in the third operating mode an output signal which serves as excitation signal as for a resonator. The presence of an interference signal (not shown) can thus be detected, if applicable, in the region of the measuring system 100b, particularly in a region of or proximate to its first input terminal E1.

Following this, a changeover to step 222 takes place according to FIG. 6C in which the measuring system 100b assumes the fourth operating mode, meaning with comparatively long delay time of the delay line 1200, which results in a particularly high measuring precision when measuring the electrical signal sl frequency. In that case, the signal generator 140 can send out one or several excitation signals as for exciting the resonator and, following a division by the power divider 150 of the six-port circuit 110, a response signal as' from the resonator is forwarded to the frequency measuring operation, described several times in the above.

Figure 5:
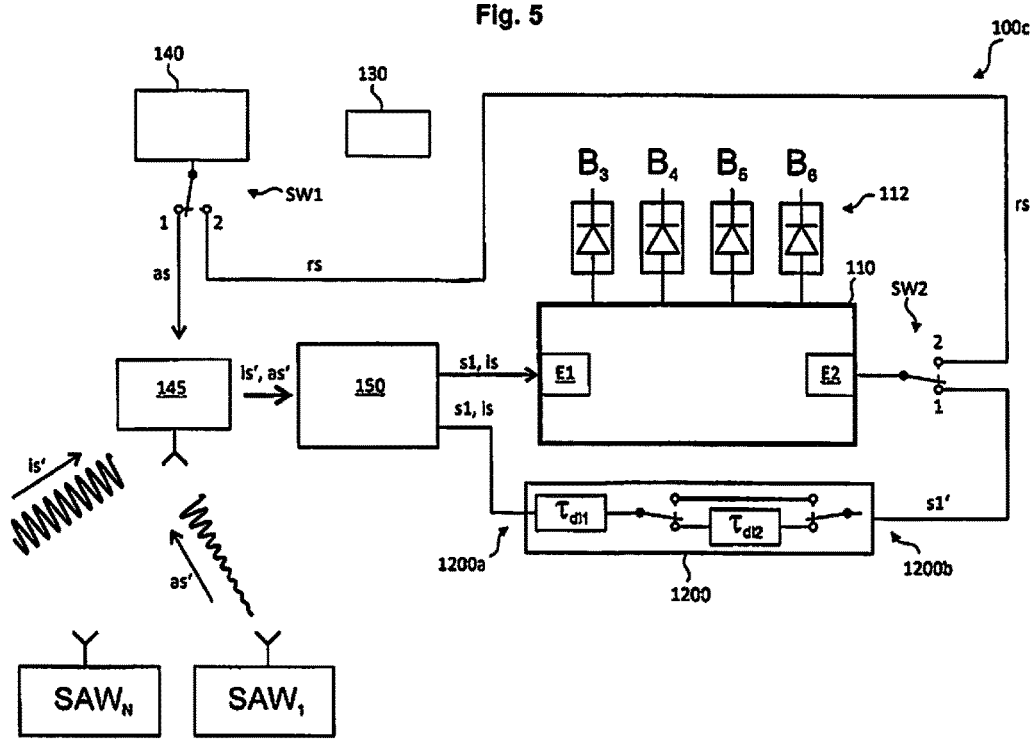
FIG. 5 A schematic block diagram of a fourth embodiment of the measuring system according to the invention.

FIG. 5 schematically shows a block diagram of a fourth embodiment 100c of the inventive measuring system, which essentially corresponds to a combination of the above-described variants of the invention, with reference to FIGS. 3, 4.

The measuring system 100c can optionally supply an excitation signal as via the first switch SW1 to the coupling device 145 for admitting the at least one resonator $SAW_1$, or it can supply a reference signal rs to the second switch SW2, respectively the second input terminal E2 of the six-port circuit 110, which is connected thereto in the second switch position "2."

With the aid of the second switch SW2, the measuring system 100c can furthermore switch between the reference signal and a delayed electrical signal s1'.

In this way, the measuring system 100c according to FIG. 5 can also be operated in the first operating mode according to the invention, which is used to measure the frequency of the electrical signal s1. The two switches SW1, SW2 in that case are respectively in their first switch positions "1."

Owing to the delay line 1200 being controllable with respect to the delay time, the measuring system 100c can advantageously switch in the first operating mode between a measuring operation with comparatively long delay time and comparatively short delay time (compare the switches of the delay line 1200, not designated further in FIG. 5, but already described in the above with reference to FIG. 4).

Insofar as the two switches SW1, SW2 of the measuring system 100c are respectively in the second switch position "2," it is possible to measure an interference signal is as described in the above with reference to FIG. 2.

For yet another advantageous embodiment, the electrical signal s1, respectively the excitation signal as or the reference signal rs, are located in at least one ISM (industrial, scientific, medical) frequency band, especially in a frequency range between approximately 2400 MHz and approximately 2500 MHz.

A different advantageous embodiment provides that the measuring system 100, 100a, 100b, 100c sends out at least at times at least one data frame, in particular a beacon data frame according to the IEEE 802.11 protocol family (the use of data frames of other protocols is also conceivable), especially so as to suggest the presence of a transmitter to other systems that may be within radio range, for example a transmitter operating based to the IEEE 802.11 protocol family. It can thus advantageously be achieved that other systems (e.g. WLAN, wireless local area network, router), which evaluate the beacon data frame of the inventive measuring system 100, 100a, 100b, 100c, can reach the conclusion that the communication or radio channel, used by the measuring system 100, 100a, 100b, 100c for sending out the beacon data frame, is occupied, wherein this may cause the other systems to no longer use the respective radio channel. As a result, fewer interference signals is admit the frequency range used by the measuring system 100, 100a, 100b, 100c according to the invention.

According to one embodiment, such a "WLAN signal" or a beacon data frame according to the IEEE 802.11 protocol family can be created, for example by activating the signal generator 140 with the aid of the arithmetic unit 130.

The generated "WLAN signal" can be radiated out, for example, using the coupling device 145, analogous to the admitting of at least one resonator with an excitation signal.

According to the measuring system 100, 100a, 100b, 100c of another advantageous embodiment, at least one data frame, in particular a beacon data frame according to the IEEE 802.11 protocol family is sent out in those cases where previously, meaning during the second operating mode, the presence of an interference signal is with a signal power exceeding a threshold was detected.

With another advantageous embodiment, a circuit for measuring phase differences can also be used alternatively or in addition to the six-port circuit 110 to determine the phase difference (d_phi=2*Pi*f*t_dl) between the electrical signal s1 and the delayed electrical signal s1' for subsequently computing its frequency f. For example, it is conceivable to use one or several I/Q mixers.

Another advantageous embodiment provides that the measuring system 100, 100a, 100b, 100c is configured to supply at least at times a linearization signal on the one hand directly to the first input terminal E1 (FIG. 1) of the six-port circuit 110 and on the other hand via the delay line 120 to the second input terminal E2 of the six-port circuit 110. The option of linearizing the measuring system is thus advantageously provided, especially the calibration of the delay line 120. This characterizes a fifth operating mode for the inventive measuring system which, for example, can preferably be used alternating with at least one of the previously described operating modes. It is especially preferable if the fifth operating mode, used for the calibration, is realized periodically.

Similar to the electrical signal s1, or the excitation signal as, or the reference signal rs, the linearization signal can be a sine-shaped signal, wherein the linearization signal advantageously has a known frequency and amplitude. The option of linearizing the measuring system, especially of calibrating the delay line 120, 1200, is thus provided, for example by using the following and previously described equation: d_phi=2*Pi*f*t_dl, which can be rewritten to read: t_dl=d_phi/(2*Pi*f). In other words, with a known phase displacement d_phi (determined through evaluating the linear signal with the six-port circuit 110) and known frequency f of the linearization signal, the actual delay time t_dl of the delay line 120, 1200 can be determined. With the value obtained in this way for the delay time, a frequency measurement can then be realized, for example with the aid of the above-described first operating mode, which is particularly precise as a result of the preceding calibration of the delay time.

With other advantageous embodiments, the above-described calibration of the delay time or the linearization can respectively be realized with at least one of the steps 200, 202, 210, 212, 220, 222 and with reference to the embodiments described in FIGS. 6A to 6C of the inventive method.

FIG. 7 contains a simplified block diagram of an embodiment of a coupling device 1450 according to the invention. For example, the above-described coupling device 145 (FIGS. 3, 4, 5) can include at least partially or completely the configuration 1450 described in the following with reference to FIG. 7.

The coupling device 1450 for the present case comprises three SPDT ("single pole double throw," changeover switch) switches 1452a, 1452b, 1452c. In addition to the three changeover switches 1452a, 1452b, 1452c, the signal generator 140 indicated with dashed rectangle, a resonator SAW and the power divider 150 are also indicated in FIG. 7 in order to describe the signal flow in the coupling device 1450, also with reference to the thereto connected components 140, SAW, 150.

FIG. 7 shows that an output signal os from the signal generator 140 can be supplied to the first terminal a1 of the changeover switch 1452a. The output signal os can be the previously described excitation signal as, for example, or the above-described reference signal rs or the above-described linearization signal is.

The first changeover switch 1452a can connect its first terminal a1 optionally to its second terminal a2 or its third terminal a3. A similar action is possible for the first terminal a5 of the second changeover switch 1452b and its second or third terminal a4, a6 as well as the first terminal a9 of the third changeover switch 1452c and its second or third terminals a7, a8. The aforementioned connection options can be controlled, for example, by the arithmetic unit 130 (FIG. 1). The changeover switches 1452a, 1452b, 1452c insofar correspond with their function to the above-described first and/or second switches SW1, SW2 (FIG. 3).

For example, if an output signal os generated by the signal generator 140 is to be supplied as excitation signal as to the resonator SAW, the first changeover switch 1452a connects its first terminal a1 to its second terminal a2, so that the output signal os is transmitted as excitation signal as to the second changeover switch 1452b, namely to its second terminal a4. The second changeover switch 1452b accordingly connects its first terminal a5 to the second terminal a4 in order to emit the excitation signal as to the resonator SAW.

Even though FIG. 7 in the present case indicates a direct connection (connecting line) between the second changeover switch 1452b and the resonator SAW, the excitation signal as for some embodiments can be transmitted from the first terminal a5 of the second changeover switch 1452b via a coupler or an antenna or a cable to the resonator SAW.

To receive the response signal as' from the resonator SAW, the second changeover switch 1452b can then connect its first terminal a5 to its third terminal a6 to emit the response signal as' via the third terminal a6 to the third changeover switch 1452c, namely its second terminal a7. The third changeover switch 1452c finally can connect its second terminal a7 to its first terminal a9 to emit the response signal as', for example to the power divider 150, so that the response signal as' is present at the power divider 150 output in the form of the electrical signal s1, according to the embodiment described in the above with reference to FIG. 1, and can be evaluated as to its frequency.

For one preferred embodiment, the excitation signal as can have a pulse, for example with a pulse duration of a few microseconds. As soon as the respective pulse has been sent to the resonator SAW, the second changeover switch 1452b can change its switching state from the connection with the terminals a4, a5 to the connection with the terminals a5, a6, to allow a further transmitting of the response signal as' as described in the above. The switching states of the second changeover switch 1452b can again be controlled by the arithmetic unit 130 or another component (e.g. discrete logic, not shown herein) of the inventive measuring system.

Another advantageous embodiment provides that the output signal os, generated by the signal generator 140, is supplied in the form of a linearization signal is directly to the power divider 150, which can also be achieved advantageously by the configuration for the coupling device 1450, shown in FIG. 7. For this, the first changeover switch 1452a is controlled such that it connects its terminals a1 and a3, so as to send the linearization signal is to the third changeover switch 1452c, namely its third terminal a8. The third changeover switch 1452c is furthermore controlled such that it connects its terminals a8 and a9, so that the linearization signal is is sent via its terminal a9 to the power divider 150. In that case, no signal is sent to the resonator SAW either, but the linearization signal is with known frequency and amplitude is transmitted via the coupling device 1450 directly from the signal generator 140 to the power divider 150 for evaluation by the six-port circuit 110 (FIG. 1). The previously described determination of the delay time for the delay line 120, 1200 can subsequently occur.

With the embodiments of the inventive measuring system previously described with reference to FIGS. 3, 5, an antenna symbol 146 is assigned as example to the terminal of the coupling device 145, assigned to the resonator SAW1, which illustrates a wireless transmission of the excitation signal as to the respective resonator $SAW_1 \ldots, SAW_N$, or a wireless transmission of the response signal as' from the respective resonator to the terminal of the coupling device 145.

The wireless transmission of the signals as, as' can be used particularly advantageously with some embodiments since no connecting lines are needed between a resonator $SAW_1$, used for example for the length measurement and/or for measuring the voltages or strains, and the remaining components of the measuring system.

Figure 8:
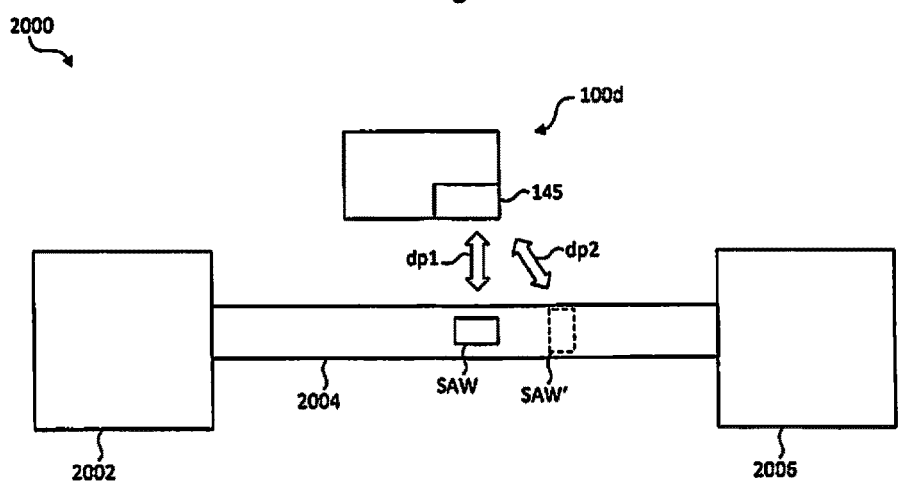
FIG. 8 A simplified, schematic block diagram according to another embodiment of the invention.

The inventive measuring system can also be used with particular advantage for the non-contacting measuring of physical variables of moving systems, which influence the resonance frequency of the resonator SAW. For example, the inventive measuring system can be used especially advantageously for measuring the torsion of a mechanical shaft. FIG. 8 shows a block diagram of a corresponding embodiment 100*d*. Also shown in FIG. 8 is a mechanical system 2000 where a rotating drive 2002, for example an electric motor, drives a unit 2006 via a shaft 2004, such as a transmission. Assigned to the mechanical system 2000 is a measuring system 100*d* according to the invention, which permits the non-contacting query of at least one of the resonators SAW arranged on the shaft 2400 (see also double arrow dp1). The resonator SAW is preferably connected to the surface of the shaft 2400, so that mechanical stress and/or strain states also transfer partially to the resonator SAW, thereby changing its resonance frequency.

The momentary resonance frequency of the resonator SAW can be determined as follows using the inventive measuring system 100*d*. The measuring system 100*d* admits the resonator SAW with an excitation signal as and receives a response signal as' emitted in a reaction thereto by the resonator SAW, the frequency of which is analyzed by the six-port circuit 110 of the measuring system 100*d*. Based on the frequency, a conclusion can be drawn concerning stress exerted on the resonator SAW and thus also the shaft 2004.

A non-contacting query dp1 of the resonator SAW is advantageously made possible in that the measuring system 100*d*, comparable to the configuration 100*a* shown in Figure three, is provided with a coupling device 145 having an antenna at the terminal assigned to the resonator SAW for the wireless transmission of the excitation signal as from the coupling device 145 to the resonator SAW and for receiving the response signal as' from the resonator SAW. The resonator SAW can thus be queried, independent of a momentary angle position of the shaft 2004, and its momentary resonance frequency can be determined within the meaning of the first inventive operating mode.

Optionally, the measuring system 100*d* can also be configured for querying additional resonators SAW' which, for example, can also be arranged on the shaft 2400 (see the additional double arrow dp2 in FIG. 8).

According to additional embodiments, the measuring system 100*d* shown in FIG. 8, with respect to its components 110, 120, 1200, 130, 140, 145, 150, can be configured at least in part in the same way as one of the variants described with reference to FIGS. 1 to 5.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. An electrical measuring system comprising:
    a six-port circuit including a first input terminal and a second input terminal;
    a delay line, wherein, in a first operating mode of the electrical measuring system, an electrical signal is supplyable directly to the first input terminal and is supplyable indirectly, via the delay line, to the second input terminal of the six-port circuit; and
    an arithmetic unit, configured to determine a frequency of the electrical signal in dependence on at least one output signal of the six-port circuit, wherein the measuring system, in a second operating mode, is configured
        to supply a reference signal to the second input terminal of the six-port circuit and to not supply a signal to the first input terminal of the six-port circuit, and
        to determine an existence of an interference signal depending on the at least one output signal of the six-port circuit.

2. The measuring system of claim 1, wherein the arithmetic unit is further configured to evaluate, in the second operating mode, at least one of at least two output signals received at different output terminals of the six-port circuit and signals derived from the at least two output signals and wherein the arithmetic unit is further configured to determine presence of the interference signal in dependence on evaluation of at least one of the at least two output signals and the signals derived from the at least two output signals.

3. The measuring system of claim 1, wherein the arithmetic unit is further configured to detect, essentially simultaneously, at least one of at least two output signals of the six-port circuit and signals from the at least two output signals of the six-port circuit.

4. The measuring system of claim 1, wherein the measuring system is configured to assume the second operating mode, so as to check for an existence of interference signals, thereby obtaining information characterizing the interference signal, and wherein the measuring system is embodied to, following the second operating mode, change to the first operating mode in dependence on the obtained information characterizing the interference signal, so as to determine the frequency of the electrical signal.

5. The measuring system of claim 1, further comprising:
at least one resonator, configured to supply the electrical signal.

6. The measuring system of claim 5, further comprising:
at least one signal generator, configured to supply at least one of the reference signal and an excitation signal to the at least one resonator.

7. The measuring system of claim 1, further comprising:
a coupling device, configured to output an excitation signal to at least one resonator and to receive an output signal from the at least one resonator and to output the received output signal from the at least one resonator to at least of at least one input of the six-port circuit and a power divider assigned to the six-port circuit.

8. The measuring system of claim 1, further comprising:
a first switch, configured to transmit a signal supplied to an input of the first switch, either to a first terminal or to a second terminal of an output of the first switch, wherein the input of the first switch is connectable to a signal generator of the measuring system, wherein the first output terminal of the first switch is connectable to a coupling device of the measuring system, and wherein the second output terminal of the first switch is connectable to at least one of at least one input of the six-port circuit and an input of a power divider assigned to the six-port circuit.

9. The measuring system of claim 1, further comprising:
a switch, to connect the second input of the six-port circuit either to a source providing the reference signal or to an output of the delay line.

10. The measuring of claim 1, wherein the delay line includes at least two selectable delay line lengths.

11. The measuring system of claim 10, wherein the measuring system is configured to select, in a third operating mode, a first delay line length of the delay line and to select, in a fourth operating mode, a second delay line length of the delay line, the second delay line length differing from the first delay line length.

12. The measuring system of claim 1, wherein the measuring system is configured to supply a linearization signal directly to the first input terminal of the six-port circuit and a linearization signal, via the delay line, to the second input terminal of the six-port circuit.

13. A method for operating an electrical measuring system including a six-port circuit, a delay line, and an arithmetic unit, the method comprising: in a first operating mode of the electrical measuring system
supplying an electrical signal directly to a first input terminal of the six-port circuit and, via the delay line, to a second input terminal of the six-port circuit, and determining, via the arithmetic unit, a frequency of the electrical signal in dependence on at least one output signal of the six-port circuit; and in a second operating mode of the electrical measuring system
supplying a reference signal to the second input terminal of the six-port circuit and not supplying a signal to the first input terminal of the six-port circuit, and
determining a presence of an interference signal, depending on at least one output signal of the six-port circuit.

14. The method of claim 13, further comprising, in the second operating mode,
evaluating, via the arithmetic unit, at least one of at least two output signals received at different output terminals of the six-port circuit and signals derived from the at least two output signals, and
determining an interference signal in dependence on the evaluating.

15. The method of claim 14, further comprising:
detecting essentially simultaneously, via the arithmetic unit, at least one of the at least two output signals and signals derived from the at least two output signals.

16. The method of claim 13, wherein the measuring system assumes the second operating mode to check for existence of interference signals, thereby obtaining information characterizing an interference signal, and wherein, following the second operating mode and in dependence on information characterizing an interference signal, the measuring system changes to the first operating mode so as to determine the frequency of the electrical signal.

17. The method of claim 16, further comprising:
determining, in dependence on the information characterizing the interference signal, a waiting period before a changeover takes place from the second operating mode to the first operating mode.

18. The method of claim 13, wherein the measuring system further includes at least one signal generator, the method further comprising:
supplying, via the at least one signal generator, at least one of the reference signal and an excitation signal for a resonator.

19. The method of claim 13, wherein the measuring system further includes a coupling device, the method further comprising:
outputting an excitation signal, via a coupling device, to at least one resonator; and
receiving an output signal from the at least one resonator and outputting the received output signal to at least one of at least one input of the six-port circuit and a power divider assigned to the six-port circuit.

20. The method of claim 13, wherein the measuring system further includes a first switch, the method further comprising:
transmitting, via the first switch, an input signal supplied to an input of the first switch, to at least one of a coupling device, an input of the six-port circuit, and an input of a power divider assigned to the six-port circuit.

21. The method of claim 13, wherein the measuring system further includes a second switch, the method further comprising:
connecting the second input of the six-port circuit, via the second switch, to a source supplying the reference signal or to an output of the delay line.

22. The method of claim 13, wherein the delay line includes at least two selectable delay line lengths, the method further comprising:
selecting, in a third operating mode of the measuring system, a first length of the delay line and, selecting, in a fourth operating mode of the measuring system, a second length of the delay line, the second delay line length differing from the first delay line length.

23. The method of claim 13, wherein the electrical signal or the reference signal is located in at least one ISM frequency band.

24. The method of claim 13, further comprising:
sending out at least one data frame according to the IEEE 802.11 protocol family, to let other systems within radio range know of an existence of a transmitter of the measuring system operating according to at least one of the IEEE 802.11 protocol family or the IEEE 802.15.4 protocol family.

25. The method of claim 24, further comprising:
sending out at least one data frame according to the IEEE 802.11 protocol family, in an event of previously determining, in the second operating mode, that an interference signal was present having a signal power exceeding a threshold value.

26. The method of claim 13, further comprising:
supplying a linearization signal directly to the first input terminal of the six-port circuit and indirectly, via the delay line, to the second input terminal of the six-port circuit.

27. The measuring system of claim 1, wherein the measuring system, in the second operating mode, is configured to determine the existence of the interference signal proximate to the first input terminal, in dependence on the at least one output signal of the six-port circuit.

28. The measuring system of claim 2, wherein the arithmetic unit is further configured to evaluate, in the second operating mode, at least one of four output signals received at different output terminals of the six-port circuit and signals derived from the four output signals, and to determine the interference signal in dependence on evaluation of at least one of the at least four output signals and the signals derived from the at least four output signals.

29. The measuring system of claim 5, wherein the at least one resonator is configured as a surface acoustic-wave resonator.

30. The measuring system of claim 1, further comprising:
at least one signal generator, configured to supply the reference signal.

31. The measuring system of claim 8, further comprising:
a second switch, to connect the second input of the six-port circuit either to a source providing the reference signal or to an output of the delay line.

32. The measuring system of claim 11, wherein the second delay line length is relatively longer than the first delay line length.

33. The method of claim 13, wherein the determining includes determining a presence of an interference signal, in region of the first input terminal, in dependence on at least one output signal of the six-port circuit.

34. The method of claim 13, further comprising, in the second operating mode,
evaluating, via the arithmetic unit, at least one of
four output signals received at four different output terminals of the six-port circuit, and
signals derived from the four output signals; and
determining the presence of the interference signal in dependence on the evaluating.

35. The method of claim 13, wherein the measuring system further includes a first switch and a second switch, the method further comprising:
transmitting, via the first switch, a reference signal or an excitation signal for a resonator, to at least one of the coupling device, an input of the six-port circuit, and an input of a power divider assigned to the six-port circuit.

36. The method of claim 22, wherein the second delay line length is relatively longer than the first delay line length.

37. The method of claim 23, wherein the electrical signal or the reference signal is located in a frequency range between approximately 2400 MHz and approximately 2500 MHz.

* * * * *